(12) United States Patent
Miyai

(10) Patent No.: US 6,657,308 B1
(45) Date of Patent: *Dec. 2, 2003

(54) METHOD FOR FORMING A SELF-ALIGNED CONTACT

(75) Inventor: Yoichi Miyai, Toride (JP)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 25 days.

(21) Appl. No.: 09/395,255

(22) Filed: Sep. 13, 1999

Related U.S. Application Data

(62) Division of application No. 09/136,698, filed on Aug. 19, 1998, now Pat. No. 6,004,870.
(60) Provisional application No. 60/057,350, filed on Aug. 26, 1997.

(51) Int. Cl.[7] .......................... H01L 23/48; H01L 25/52; H01L 29/40; H01L 29/76; H01L 29/94
(52) U.S. Cl. .......................... 257/774; 257/382; 257/383
(58) Field of Search ................................ 257/382, 387, 257/774, 602, 383, 773; 438/229, 230, 330, 265, 585, 586, 666, 637, 672, 233

(56) References Cited

U.S. PATENT DOCUMENTS

| | | | | | |
|---|---|---|---|---|---|
| 5,158,910 A | * | 10/1992 | Cooper et al. | ............... | 438/631 |
| 5,270,236 A | * | 12/1993 | Rosner | ....................... | 438/637 |
| 5,710,061 A | * | 1/1998 | Cleeves | ...................... | 438/618 |
| 5,828,121 A | * | 10/1998 | Lur et al. | ................... | 257/522 |
| 5,888,896 A | * | 3/1999 | Givens | ....................... | 438/622 |
| 5,902,132 A | * | 5/1999 | Misuhashi | .................. | 438/666 |
| 6,010,955 A | * | 1/2000 | Hashimoto | .................. | 438/597 |
| 6,033,977 A | * | 3/2000 | Gutsche et al. | ............. | 430/618 |

FOREIGN PATENT DOCUMENTS

| | | | | | |
|---|---|---|---|---|---|
| JP | 64-59940 | * | 3/1989 | ........... | H01L/21/90 |

\* cited by examiner

*Primary Examiner*—Shouxiang Hu
(74) *Attorney, Agent, or Firm*—Jacqueline J. Garner; Wade James Brady, III; Frederick J. Telecky, Jr.

(57) ABSTRACT

An improved method for forming a contact well for a semiconductor device (10) is disclosed. According to this method, a first insulator layer (24) comprising an insulating material is formed around a gate (20). A contact well filler (32) is then formed adjoining the first insulator layer (24). A second insulator layer (34) comprising the insulating material is formed around the first insulator layer (24) and the contact well filler (32). The contact well filler (32) is then removed to form the contact well (36) in the second insulator layer (34). This method allows the use a non-hazardous selective etchant to form the contact well. The semiconductor device (10) formed in accordance with the present invention also exhibits low parasitic gate capacitance, high switching speed and low power consumption.

4 Claims, 3 Drawing Sheets

METHOD FOR FORMING A SELF-ALIGNED CONTACT

CROSS REFERENCE TO PRIOR APPLICATIONS

This application is a division of Ser. No. 09/136,698, filed Aug. 19, 1998, now U.S. Pat. No. 6,004,870 which claims priority from provisional application Serial No. 60/057,350, filed Aug. 26, 1997 under 35 U.S.C. 119(e).

TECHNICAL FIELD OF THE INVENTION

This invention relates generally to the field of semiconductor devices, and more particularly to an improved method for forming a self-aligned contact.

BACKGROUND OF THE INVENTION

In the art of field effect transistor (FET) fabrication, it is often desirable to perform processes which are self-aligning. For example, techniques for implanting self-aligned source and drain pockets in a substrate after a gate has been deposited on the substrate are well known.

In addition, a technique for forming a self-aligned contact to a source or drain pocket has been established. This technique typically involves forming an insulating shield layer of silicon nitride over and around the gate. Another insulator layer of silicon dioxide is then deposited on the gate and substrate. A hole is then patterned and etched into the silicon dioxide layer, forming a self-aligned contact well that adjoins the silicon nitride barrier layer and exposes an area of the source or drain pocket. A contact material may then be deposited in the contact well to form an electrical contact to the source or drain pocket.

Formation of a self-aligned source or drain contact using the above-described technique requires, in the contact well formation step, an etchant that removes silicon dioxide but is selective against silicon nitride. The etchant typically used for this purpose is carbon monoxide gas, which is hazardous to store and dispose of due to its poisonous nature.

Moreover, the relatively high dielectric constant of the silicon nitride layer surrounding the gate results in a high parasitic gate capacitance. Consequently, a FET fabricated according to this technique exhibits the undesirable properties of high power consumption and low switching speed.

SUMMARY OF THE INVENTION

Therefore, a need has arisen for a method for forming a self-aligned contact that addresses the disadvantages and deficiencies of the prior art.

An improved method for forming a contact well for a semiconductor device is disclosed. In accordance with this method, a first insulator layer comprising an insulating material is formed around a gate. A contact well filler is then formed adjoining the first insulator layer. A second insulator layer comprising the insulating material is formed around the first insulator layer and the contact well filler. The contact well filler is then removed to form the contact well in the second insulator layer.

A technical advantage of the present invention is that a non-hazardous selective etchant may be used to form the contact well. Another technical advantage is that the semiconductor device formed in accordance with the present invention exhibits low parasitic gate capacitance, high switching speed and low power consumption.

BRIEF DESCRIPTION OF THE DRAWINGS

For a more complete understanding of the present invention and for further features and advantages thereof, reference is now made to the following description taken in conjunction with the accompanying drawings, in which.

DETAILED DESCRIPTION OF THE INVENTION

Figure 1A:
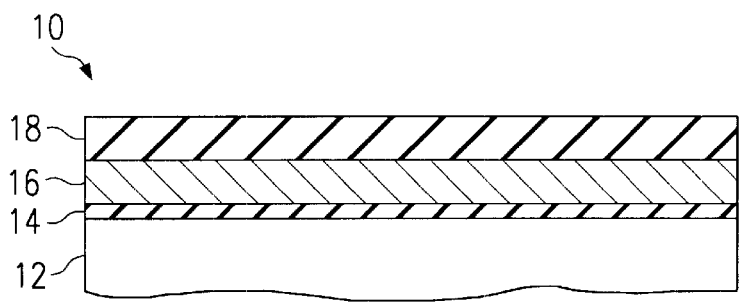
FIGS. 1A through 1K are cross sections of a semiconductor device with a self-aligned contact well at various stages of fabrication in accordance with the invention.

FIGS. 1A through 1K illustrate a method for forming a self-aligned contact to a, source or drain in accordance with the present invention. Referring to FIG. 1A, a cross section of a semiconductor device 10 during fabrication is shown. Semiconductor device 10 includes a substrate 12 covered by a first insulator layer 14, a conductive layer 16 and a second insulator layer 18. Substrate 12 comprises silicon, silicon on insulator (SOI), or any other appropriate substrate for semiconductor fabrication. Substrate 12 may comprise a layer of material formed over a substrate of a semiconductor device.

Insulator layer 14 comprises silicon dioxide or any other material with suitable insulating properties. In one embodiment, insulator layer 14 comprises a thermally grown layer of silicon dioxide with a thickness of approximately 8 nm.

Conductive layer 16 comprises polysilicon or any other suitable conductive material. In one embodiment, conductive layer 16 comprises a polysilicon layer deposited using low pressure chemical vapor deposition (LPCVD), with a thickness of approximately 100 nm.

Insulator layer 18, like insulator layer 14, comprises silicon dioxide or any other material with suitable insulating properties. In one embodiment, insulator layer 18 comprises a layer of silicon dioxide deposited using LPCVD or plasma enhanced chemical vapor deposition (PECVD), with a thickness of approximately 100 nm.

Figure 1B:
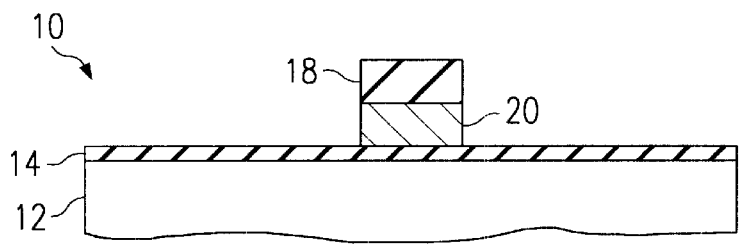

A photoresist (not shown) is then patterned onto insulator layer 18, and the portions of insulator layer 18 and conductive layer 16 not covered by the photoresist are etched away using, for example, anistropic dry etches. Referring to FIG. 1B, the remaining conductive material forms a gate 20 with a width of approximately one micron.

Figure 1C:
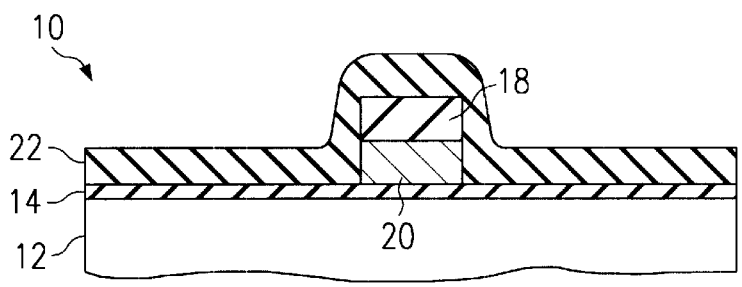

Referring to FIG. 1C, a third insulator layer 22 is deposited over insulator layer 14 and insulator layer 18. Insulator layer 22 may be a layer of silicon dioxide deposited using LPCVD or PECVD, with a thickness of approximately 80 nm.

Figure 1D:
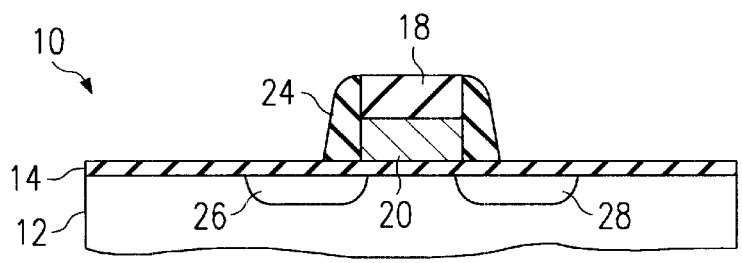

Referring to FIG. 1D, insulator layer 22 is etched using, for example, an anisotropic dry etch. Insulator layer 22 may be etched back to the level of insulator layer 14, or to the level of substrate 12. If insulator layer 22 is etched back to the level of substrate 12, then insulator layer 14 is subsequently re-formed, for example by thermally growing a silicon dioxide layer with a thickness of approximately 8 nm.

As a result of the foregoing steps, an insulating shield layer 24 is formed from the remaining portions of insulator layers 18 and 22 around gate 20, and insulator layer 14 continues to cover the surface of substrate 12. Source and drain pockets 26 and 28 are then implanted using well-known implantation techniques.

Figure 1E:
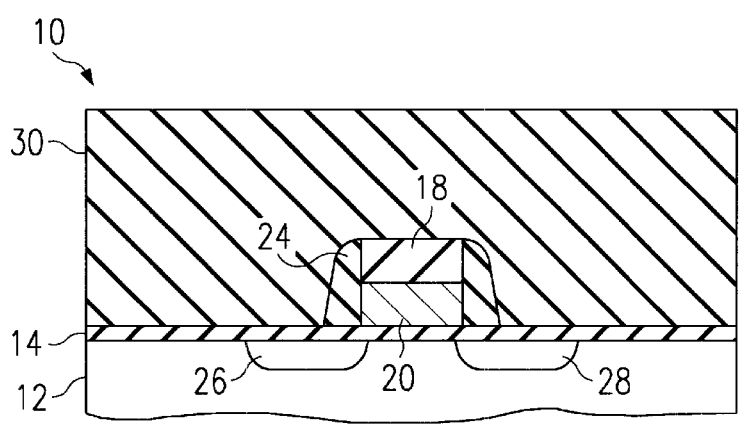

Referring to FIG. 1E, a spacer layer 30 is deposited over insulator layers 14 and 24. Spacer layer 30 preferably comprises a material that may be etched away using an anisotropic etchant that does not significantly affect insulator layers 14 and 24. Spacer layer 30 may be, for example, a layer of polysilicon deposited using LPCVD, with a thickness of approximately 600 nm. The top of spacer layer 30 is planarized and reduced to a thickness of approximately 500 nm using, for example, the well-known technique of chemical mechanical polishing (CMP).

Figure 1F:
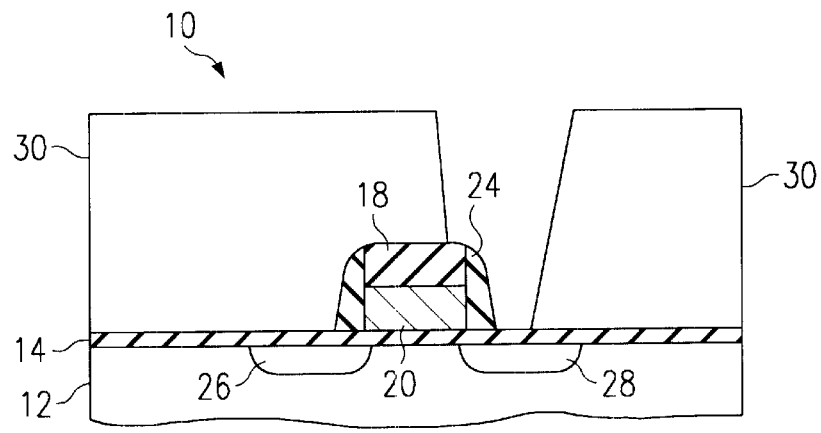

Referring to FIG. 1F, a photoresist (not shown) is patterned onto spacer layer 30, and the portion of spacer layer 30 not covered by the photoresist is etched away using, for example, an anistropic dry etch. A cavity is thereby formed in spacer layer 30, for example with a diameter of approximately 200 nm at the top and a taper angle of approximately 89°.

Figure 1G:
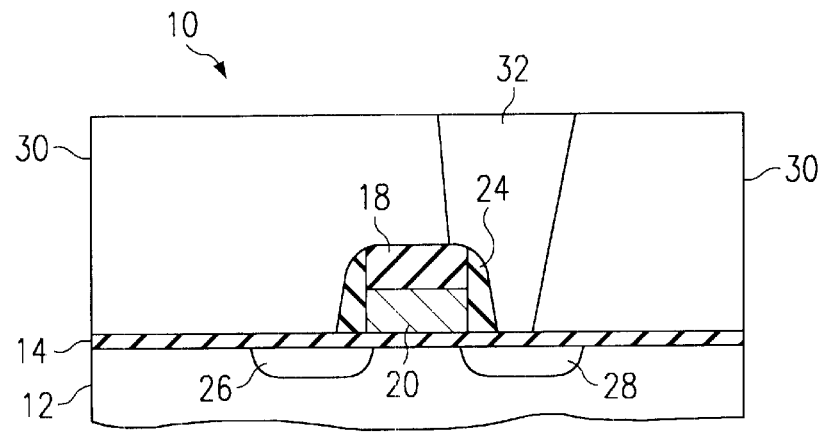

Referring to FIG. 1G, a contact well filler 32 is deposited on spacer layer 30 and within the cavity formed in spacer layer 30. Contact well filler 32 preferably comprises a material that may be etched away using an etchant that does not significantly affect insulator layers 14 and 24. Contact well filler 32 may, for example, comprise silicon nitride.

Contact well filler 32 may be deposited with a thickness of approximately 150 nm. Contact well filler 32 is then removed down to the level of spacer layer 30. For example, contact well filler 32 may be etched using an anisotropic dry etch to a level at or below the level of spacer layer 30. Alternatively, contact well filler 32 may be reduced by CMP to the level of spacer layer 30.

Figure 1H:
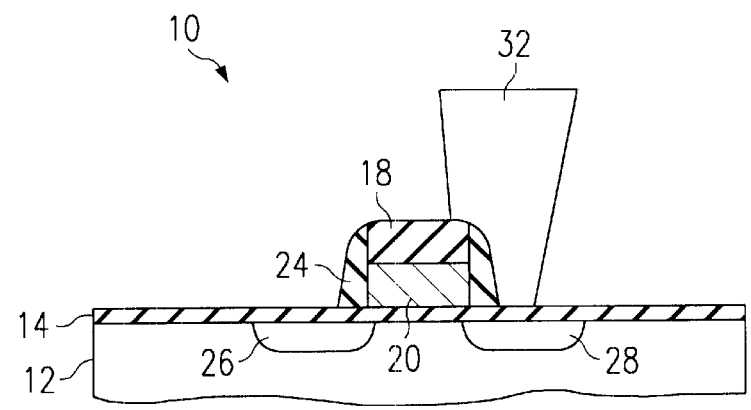

Referring to FIG. 1H, spacer layer 30 is removed, leaving contact well filler 32 as a free-standing pillar. Spacer layer 30 may, for example, be removed using a choline wet etch.

Figure 1I:
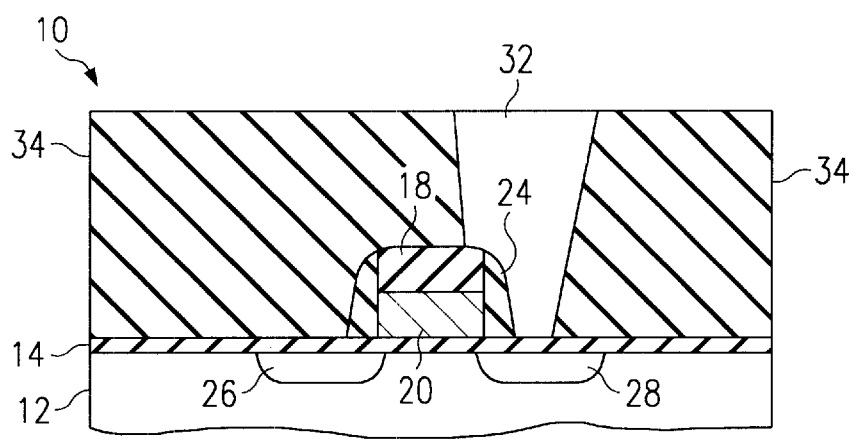

Referring to FIG. 1I, a fourth insulator layer 34 is deposited on contact well filler 32 and insulator layers 14 and 24. Insulator layer 34 preferably comprises the same material as insulator layer 24. For example, insulator layer may be a layer of silicon dioxide deposited using LPCVD or PECVD, with a thickness of approximately 600 nm. Insulator layer 34 is then planarized to the level of contact well filler 32 using, for example, CMP.

Figure 1J:
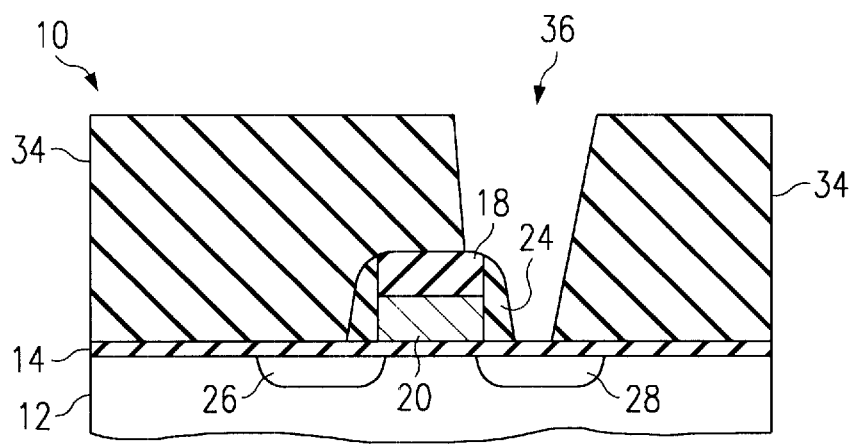

Referring to FIG. 1J, contact well filler 32 is removed to form a contact well 36 in insulator layer 34. Contact well filler 32 may be removed using, for example, a wet etch of phosphoric acid, which removes the silicon nitride of contact well filler 32 but is selective against the silicon dioxide of insulator layers 14, 24 and 34.

Figure 1K:
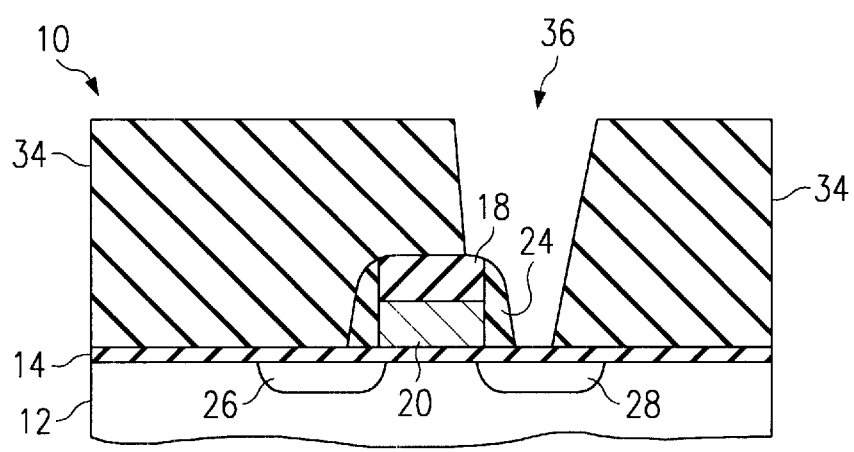

Referring to FIG. 1K, a small portion of insulator layer 14 at the bottom of contact well 36 is removed to expose a portion of source or drain pocket 28. Insulator layer 14 may, for example, be removed using an anisotropic dry etch. This etch will remove a small amount of material from insulator layers 24 and 34, but insulator layer 24 will retain sufficient thickness to separate and insulate gate 20 from contact well 36.

After contact well 36 has been formed using the foregoing steps, a contact material (not shown) may be deposited in contact well 36 to form a contact with source or drain pocket 28. The resulting semiconductor device 10 may be, for example, a FET formed as part of a memory array, a microprocessor or any other semiconductor device.

It will be appreciated that contact well 36 was formed without the need for a selective etch of silicon dioxide against silicon nitride. The selective etchant used in the above-described method, phosphoric acid, is much less hazardous to store and dispose of than the carbon monoxide gas used in known device fabrication methods.

The above-described method for forming contact well 36 has an additional advantage in that insulator layer 24 surrounding gate 18 is made of silicon dioxide. Silicon dioxide has a significantly lower dielectric constant than silicon nitride. As a result, semiconductor device 10 has a low parasitic gate capacitance and exhibits high switching speed and low power consumption compared to devices fabricated using known contact formation methods.

While the invention has been particularly shown and described by the foregoing detailed description, it will be understood by those skilled in the art that various other changes in form and detail may be made without departing from the spirit and scope of the invention.

What is claimed is:

1. A partially fabricated contact well for a semiconductor device comprising:
    a substrate having a doped region extending to a surface of said substrate;
    a gate insulating layer disposed adjacent said doped region and overlying said surface of said substrate;
    a gate disposed over said gate insulating layer;
    a first insulating layer etchable by a first etchant completely enclosing said gate in conjunction with said gate insulating layer;
    a second insulating layer etchable by said first etchant overlying a first portion of said first insulating layer and a first portion of said gate insulating layer and having an aperture therein extending to a second portion of said first insulating layer and a second portion of said gate insulating layer; and
    a third insulating layer disposed within said aperture, said third insulating layer being removable through etching by a second etchant other than carbon monoxide gas, said second etchant being selective to said third insulating layer relative to said first and second insulating layers,
    wherein said third insulating layer is in direct contact with said second portion of said gate insulating layer and is separated from said substrate by said second portion of said gate insulating layer; and wherein said second insulating layer is silicon oxide and said third insulting layer is silicon nitride.

2. The partially fabricated contact well of claim 1 wherein said second etchant is phosphoric acid.

3. The semiconductor device of claim 1 wherein said doped region is a source/drain pocket.

4. The partially fabricated contact well of claim 3 wherein said second etchant is phosphoric acid.

* * * * *